(12) United States Patent
Daners

(10) Patent No.: US 6,229,393 B1
(45) Date of Patent: May 8, 2001

(54) HIGH FREQUENCY POWER GENERATOR

(75) Inventor: Felix Daners, Schaffhausen (CH)

(73) Assignee: Storz Endoskop GmbH (DE)

( * ) Notice: Subject to any disclaimer, the term of this patent is extended or adjusted under 35 U.S.C. 154(b) by 0 days.

(21) Appl. No.: 09/359,834

(22) Filed: Jul. 23, 1999

Related U.S. Application Data

(63) Continuation-in-part of application No. 09/012,494, filed on Jan. 23, 1998, now abandoned.

(30) Foreign Application Priority Data

Jan. 22, 1997 (DE) .................................................. 197 02 007

(51) Int. Cl.$^7$ ........................................................ H03F 3/38
(52) U.S. Cl. ........................................ 330/251; 330/207 A
(58) Field of Search ................................... 330/10, 207 A, 330/251

(56) References Cited

U.S. PATENT DOCUMENTS

| 4,326,170 | 4/1982 | Levy | 330/10 |
|---|---|---|---|
| 4,608,541 | 8/1986 | Moriwaki et al. | 330/10 |
| 5,118,997 | 6/1992 | El-Hamamsy | 315/248 |
| 5,398,003 | * 3/1995 | Heyl et al. | 330/251 X |
| 5,434,540 | 7/1995 | Yamamoto et al. | 330/251 |
| 5,510,753 | * 4/1996 | French | 330/251 X |
| 5,594,375 | * 1/1997 | Carlson et al. | 330/251 X |

FOREIGN PATENT DOCUMENTS 38 05 921 A1   9/1998 (DE) .

\* cited by examiner

Primary Examiner—Steven J. Mottola
(74) Attorney, Agent, or Firm—St. Onge Steward Johnston & Reens LLC

(57) ABSTRACT

A high frequency power generator comprises
 a power amplifier working in switching operation,
 an output filter, having at least one series resonant circuit and at least one parallel resonant circuit, and
 a digital controller including a phase-synchronizable oscillator,
wherein the frequency of the drive voltage of the power amplifier is produced upon stimulation of oscillation by the digital controller with the timing pulse of the oscillator, and the digital controller filters off feedback from the high frequency power generator in such manner that the frequency of the drive voltage of the power amplifier lies in a defined frequency range.

18 Claims, 5 Drawing Sheets

HIGH FREQUENCY POWER GENERATOR

CROSS REFERENCE TO RELATED APPLICATION

This application is a continuation-in-part of U.S. Ser. No. 09/012,494, filed Jan. 23, 1998, entitled "High Frequency Power Amplifier,"now abandoned.

BACKGROUND OF THE INVENTION

The present invention relates to a high frequency power generator particularly for use in high frequency surgery.

1. Field of the Invention

High frequency power at high output is needed in various industrial, medical or scientific applications. As examples of industrial applications, drying appliances operating by heating a material through dielectric losses in a high frequency field, or smelting apparatus in which the heating of a material to be molten is effected by means of eddy currents in a high frequency field may be mentioned. In scientific work, high frequency power is needed for the excitation of a plasma, for example in spectral analysis or nuclear fusion reactors. In medicine, high frequency power with high output is needed in high frequency surgery, for example.

In many applications the load on a high frequency power generator is not constant, but often subject to very large and sudden changes. For example, in high frequency surgery the impedance of a surgical probe connected to a high frequency power generator can vary between about 50 ohms and 4 kiloohms within milliseconds. Even the reactive component of a load impedance may vary rapidly within wide ranges. Thus, very fast changes of the reactive component of a load impedance may occur when a surgical probe is rapidly removed from the tissue being cut.

It is common to most applications of high frequency power generators that the effect to be caused by means of the high frequency power does not depend upon strict maintenance of the frequency value. In high frequency surgery, for example, frequencies between 300 kHz and 2 MHz are commonly used. In this, it is not of substantial consequences when, for example, a deviation from the frequency range set in any particular case amounts to about 10% in either direction. In high frequency smelting furnaces the frequencies used may even be between 200 kHz and 27 MHz.

At the same time, the applications just described require generators to have a high efficiency. For example, ventilators for cooling a high frequency surgical instrument are not desired in an operating theatre, because the flow of cool air could whirl up bacteria. With an available high frequency output of 400 W, a high frequency power generator must have an efficiency of at least 90 percent, for example, in order that the instrument will not overheat.

To attain these required high efficiencies, it is nowadays the practice for semiconductor amplifier components that operate in a switching mode to be used in the power generators. At present most high frequency surgical instruments operate on this principle.

Because of the switching operation, harmonics are generated in the frequency spectrum of the output current, this having various disadvantages. In high frequency surgery the harmonics of much higher frequency than the actual operating frequency may cause high capacitive current leaks which present a risk of the patient becoming burnt. Moreover, the unavoidable scattering components of the circuit produce strong overshoot pulses which endanger the operational safety of the amplifier components by causing overvoltages. Furthermore, unlimited efficiencies cannot be attained with switching amplifiers because of the switching delay of the amplifier components.

2. Description of Related Art

From the document DE-A-38 05 921, for example, it is known to employ power amplifiers having transistors connected as a quasi-complementary stage and functioning in switching operation. Connected in series to the output of this power amplifier is a series resonant circuit which conducts the output current to a grounded parallel resonant circuit connected in parallel. The series resonant circuit connected in series and the parallel resonant circuit connected in parallel are each tuned to the mean operating frequency.

The series resonant circuit makes it possible for the output current of the power amplifier to be almost completely sinusoidal.

With the parallel resonant circuit, the load impedance at the operating frequency is brought to a real value, in order substantially to avoid phase shifts between current and voltages as well as reactive currents.

From the description of the high frequency power generator in DE-A-38 05 921 it is also known that the drive voltage of the power amplifier is supplied by an auxiliary oscillator at the instant of stimulation of oscillation, and that following the stimulation of oscillation the drive of the power amplifier is changed over in such a manner that the drive voltage of the power amplifier is then generated through a current regeneration or feedback when the magnitude of the load impedance connected to the high frequency power generator falls below a characteristic preset value, and through a voltage regeneration or feedback when the opposite is the case. Furthermore, according to DE-A-38 05 921 an electronic switch is provided for enabling a change-over between the two possibilities of feedback even during operation, when with fluctuating load impedances the preset value is exceeded or fallen short of.

However, the high frequency power generator described in DE-A-38 05 921 has the disadvantage of being equipped with a relatively large number of components, and also of the stability of the circuit not being assured under capacitive loads.

In high frequency surgery it is possible to achieve coagulation with good reproducibility by applying a constant output voltage. It is therefore of advantage for the high frequency generator to produce an output voltage that is independent of the load as far as possible. Usually the output voltage of the high frequency generator is controlled through the d.c. supply voltage of the generator. In order for this to function well, the high frequency power generator should have a transformation ratio of the output voltage to the d.c. supply voltage that is constant and, as far as possible, independent of the load conditions.

With the arrangement shown in DE-A-38 05 921, conditions may arise under capacitive load which causes the output filter to be so out of tune that a stable current feedback condition can occur at several frequencies. However, only one frequency has the desired property of the transformation ratio remaining constant. At the other frequencies a high overvoltage may occur, which may have detrimental effects such as the patient becoming imparted with undesirably heavy necroses on the edges of a cut.

BRIEF SUMMARY OF THE INVENTION

It is the object of the present invention to avoid the aforementioned disadvantages of prior art and thus to describe a high frequency power generator which provides a stable performance with capacitive loads and which thus operates reliably and also requires as few components as possible.

According to the present invention, a high frequency power generator is provided, comprising:

a power amplifier working in switching operation, an output filter having at least one series resonant circuit and at least one parallel resonant circuit, and a digital controller including a phase-synchronizable oscillator, wherein the frequency of the drive voltage of the power amplifier is produced upon stimulation of oscillation by the digital controller with the timing pulse of the oscillator, and the digital controller filters off feedback from the high frequency power generator in such manner that the frequency of the drive voltage of the power amplifier lies in a defined frequency range.

The drive or triggering voltage of the power amplifier at the instant of stimulation of oscillation is generated by the digital controller from the oscillation timing pulse. In this, the regenerative or positive feedback serving for self-excitation affects the digital controller even during the stimulation of oscillation in such manner that the drive voltage of the power amplifier is determined not only by the oscillator timing. The digital controller may, for example, filter the feedback in such manner that the drive voltage of the power amplifier lies within a precisely defined frequency band or interval.

It is of advantage that the drive voltage of the power amplifier is also generated by the digital controller following the stimulation of oscillation. Because of this measure the generator of the present invention, as distinct from the generator of the aforementioned DE-A-38 05 921, for example, needs no auxiliary oscillator for supplying a control voltage for the power amplifier at the instant of stimulation of oscillation. In the present invention the digital controller needs a clock in order to drive a finite state machine. This clock is represented by the oscillator, and the frequency of this oscillator is chosen so that a desired frequency window or range is obtained within which the digital controller can filter off the feedback signals from the series and parallel resonances.

Furthermore, it is preferred that no change-over occur between external excitation and self-excitation of the high frequency power generator. This means, for example, that no change-over switch is needed.

In a further development, a voltage derived from a feedback signal from the output current circuit or output voltage circuit of the high frequency power generator is used for synchronizing the drive voltage of the power amplifier. Because of this measure, the high frequency power generator can react quickly to changes in the output circuit such as those of load impedances.

Furthermore, it is preferred to have a series resonant circuit connected as the first filter component to follow the power amplifier. Moreover, it is advantageous for the oscillator to be a quartz oscillator. This measure ensures precise timing.

In another development the resonant circuits are tuned approximately to the mean operating frequency. For this it is also conceivable that the resonance frequency of the resonant circuits itself be adjustable.

Furthermore, when current regeneration or feedback is used, it is preferred that the magnitude of the load impedance of the output circuit remain below a preset value that is dependent upon the phase of the load impedance. The feedback signal can be formed from the output circuit by way of a transformer or converter and a pulse shaper stage from the current that flows through the series resonant circuit. When the magnitude of the load impedance of the output circuit exceeds a preset value that is dependent upon the phase of the load impedance, it is preferable for a voltage feedback to be applied.

For this, the feedback signal is advantageously taken from the output circuit via a transformer or converter and a pulse shaper stage from the voltage on a parallel resonant circuit. By means of these measures the stability of the operating performance of the high frequency power generator is further increased.

The above-mentioned pulse shaper stage is not strictly necessary, but it serves to protect a zero passage detector from too large input signals.

A switch is preferably provided for changing-over between current and voltage regeneration or feedback during operation.

In a further preferred development a current limitation is provided which, in particular, takes the form of a flip-flop. By means of this measure, the current limitation is activated, for example, in each period when the maximum current is exceeded.

It is furthermore of advantage to re-set the kind of feedback at least at each half-wave.

Moreover, the oscillator is preferably designed to be a component of the digital controller. This makes the appliance even more compact.

For operation of the switching amplifier at frequencies around 300 kHz, it is also preferred that the switching amplifier have MOSFET transistors. In comparison with bipolar transistors or other components with controlled p-n junctions, MOSFET transistors have the advantage of a symmetrical switching performance when switching on or off. In addition, they have a parasitic reverse diode, so that a separate diode, as needed with bipolar transistors, is not necessary.

In the following the invention will be described by way of example without limitation of the general inventive concept with the aid of embodiments and with reference to the drawings to which attention is expressly drawn concerning the disclosure of all details of the invention not explained in greater detail in the text.

DETAILED DESCRIPTION OF THE INVENTION

Figure 1A:
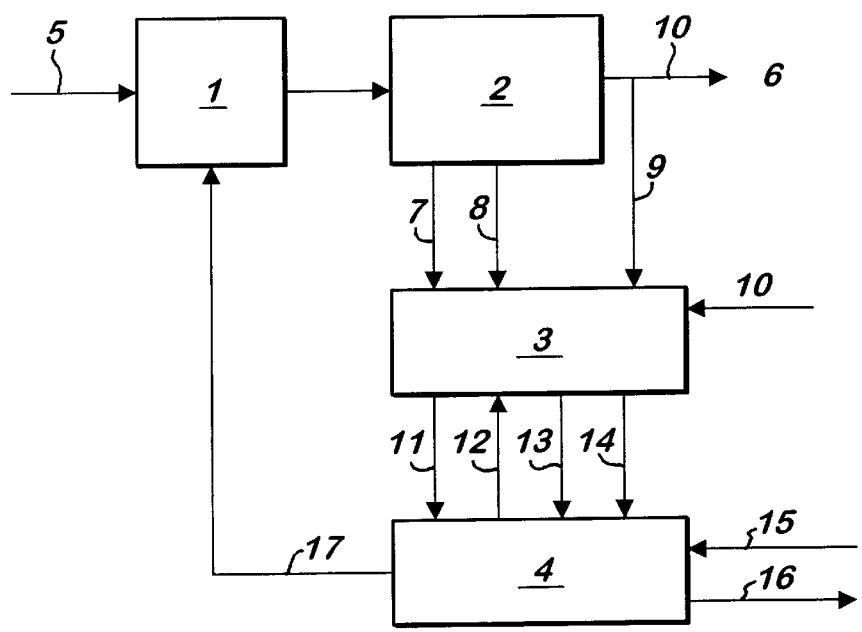
FIG. 1a is a simplified block circuit diagram of a continuously operable high frequency power generator according to the invention.

In each of the Figures, the same or corresponding components have been designated with the same reference numerals, so that repetitions of description can be dispensed with and explanations need be given merely of the differences of the embodiments illustrated in these Figures from the first embodiment.

Figure 1B:
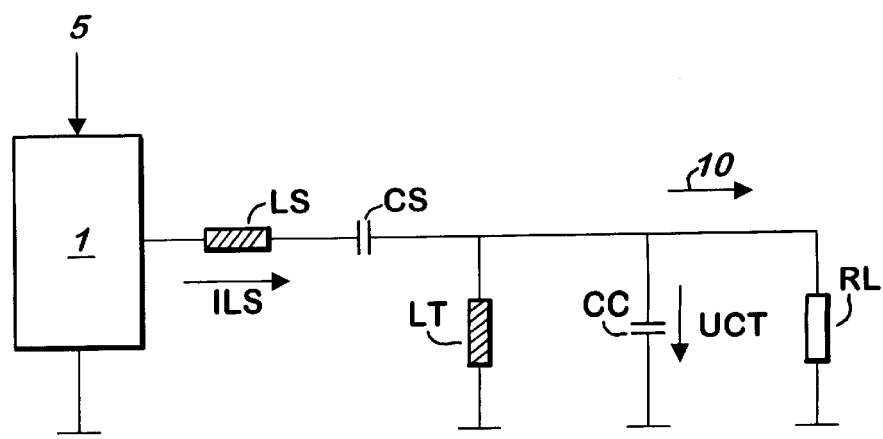
FIG. 1b is a schematic illustration of an L.C. network.
Figure 1C:
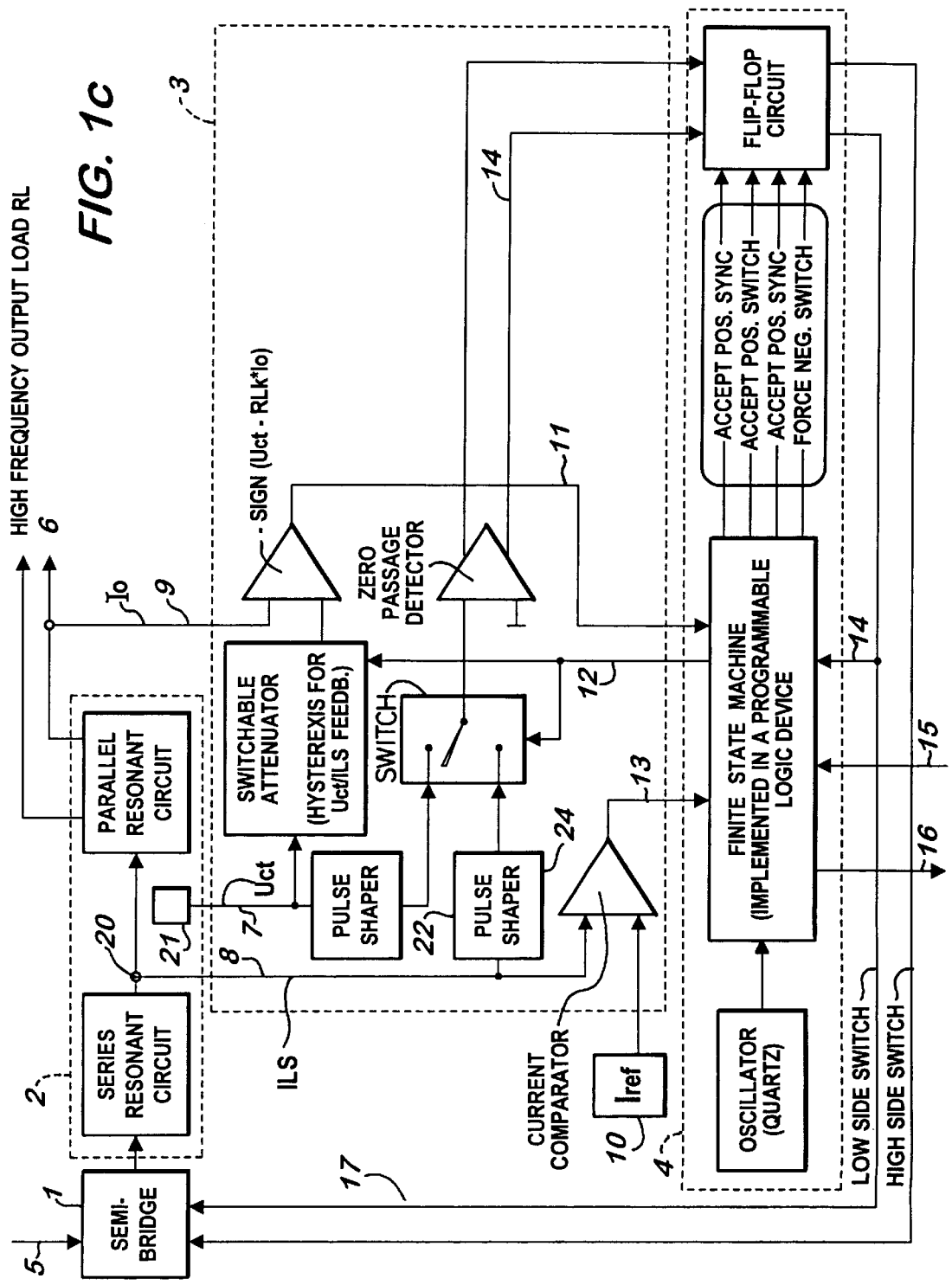
FIG. 1c is a more detailed block circuit diagram of a high frequency power generator according to the invention.

FIG. 1a shows a simplified circuit diagram and FIG. 1c a more detailed circuit diagram of an embodiment of a high frequency power generator according to the invention. A d.c. current or d.c. voltage 5 is connected to a MOSFET semi-bridge 1. The MOSFET semi-bridge 1 operates as a switch amplifier and actuates a high-side switch or a low-side switch according to the signals on a line 17 for the drive or trigger signal of the high-side switch and the low-side switch. It is advantageous for this drive to be amply dimensioned in order that brief switching times of less than 150 ns, for example, may be achieved.

Disposed to follow the semi-bridge 1 is an L.C. network 2 shown in detail in FIG. 1b and designed, for example, for a critical load resistance $RL_k$=800 ohms. For this, the L.C. network 2 may consist of a series resonant circuit LS, CS and a parallel resonant circuit LT, CC, the series resonant circuit being disposed closer to the semi-bridge 1 than the parallel resonant circuit.

Disposed to follow the parallel resonant circuit is a high frequency output terminal 6. The high frequency output terminal 6 serves as a tap for the generator output current $I_0$ which is conducted to a switching block 3. The latter has two comparator functions, a feedback change-over function and a zero passage detection function. A limit value setting 10 acts on the switching block 3. In addition, a feedback or regeneration signal 12, issuing from the digital controller 4, is conducted to the switching block 3. Leads from the switching block 3 to the digital controller 4 carry a phase synchronization signal 14, a current 13 derived from an excess current or overcurrent $I_{ts}$ via a current comparator from the series resonant circuit, and a comparator signal 11 corresponding to the function sign ($U_{ct}$—$RL_k*I_0$).

A start/stop modulation 15 is applied to the digital controller 4. The d.c. current is limited by the digital controller 4 which is also provided with an oscillator. In addition, the drive signals high-side switch and low-side switch from the digital controller 4 are fed to the semi-bridge 1.

A comparator in the switching block 3 monitors, for example, the positive half-wave on currents that are greater than 20 A. The output signal 13 from the switching block 3, indicating an overcurrent in the series resonant circuit, is processed by the finite state machine in the digital controller 4.

The function sign ($U_{ct}$—$RL_k*I_0$), where $U_{ct}$ is the voltage on the parallel resonant circuit, $RL_k$ is the critical load resistance, and $I_0$ is the generator output current (see also FIG. 1b), which is generated by the comparator, leads to emission under a real load of a signal with a phase of 180° with respect to the voltage in the parallel resonant circuit, when the product of the generator output current and the critical load resistance is greater than the voltage in the parallel resonant circuit. At this switching point, the feedback of the switching amplifier under a real load is synchronized with the current in the series resonant circuit. A scanning of the output signal is made by the digital controller 4 at discrete time intervals. With complex load impedances a different change-over point is attained. Because of the complex load, the filter characteristics and thus the critical resistance also become changed, wherein the other switching point is the one desired.

The zero passage detector which is also designed as a comparator detects the zero passages from the voltage in the parallel resonant circuit or the current in the series resonant circuit according to the kind of feedback which is acting. In this, the change-over is made with the aid of an analog switch. It is of advantage for the comparator to be very fast and to have an inverted and a non-inverted output. A rapid zero passage detector is necessary in order to make possible an appropriate phase detection with the brief switching times attained by the MOSFET semi-bridge.

The digital controller 4 includes a digital phase synchronization circuit and an evaluation circuit for the comparator signals 11, 13, 14 for current limitation and the choice of the feedback signal. These circuits are located in a programmable logic device.

Figure 2:
FIG. 2 shows the variation of an output signal from a phase-synchronized oscillator with time.
Figure 2:

The zero passage detector disposed in the switching block 3 produces an unusable output signal particularly at the stimulation of oscillation, i.e. when no feedback signal of sufficient amplitude is yet available. This signal can be tuned out with the output signal of the digital phase synchronization circuit, as illustrated in FIG. 2. HSW here designates the drive signal of the high-side switch and LSW the drive signal of the low-side switch.

During the time interval Tfix the digital phase synchronization circuit accepts no synchronization signal, this being the momentarily chosen feedback signal. The time interval Tvar is ended by the appearance of a synchronization signal or by a time-out. With this, the maximum and minimum output frequency are also established. In addition, it is ensured that in the switching amplifier the LC network will not be completely falsely excited in the case of a spurious synchronization signal, caused for example by spikes or the like. With this it is possible to perform a synchronization within each half-period. It is also possible for the circuit to be synchronized to zero phase. Furthermore, the duty cycle can also be performed within a precisely defined range.

This response is achieved with the aid of a flip-flop and a finite state machine. The flip-flop makes possible the asynchronous characteristics whilst the finite state machine is designed as a synchronous logic. During the time interval Tfix a certain number of periods of the quartz oscillator are counted. During this, the terminals of the flip-flop are blocked. As soon as the time interval Tfix has ended, i.e. when the time interval Tvar begins, one terminal of the flip-flop is unblocked. Now the output can be set by the synchronization signal. The time-out is counted by means of a predetermined number of periods of the quartz oscillator. The finite state machine ends the count of the time-out at the beginning of the next period of the quartz oscillator, provided that the output has been set by the synchronization signal. After the time-out the flip-flop is set to the correct status, provided that this has not already been done by the synchronization signal. This mechanism is designed to be symmetrical and completely independent for both half-waves.

In addition and at the same time a start-stop modulation is achieved which takes into account a stop signal before each beginning of a time interval Tfix of the positive half-wave. Thus, in this embodiment, modulation is always performed with an even number of half-waves. Provided that the generator is being or has been shut off, both MOSFETS of the semi-bridge are switched off.

In this embodiment the current limitation is achieved using a flip-flop. This can be set or cleared, for example, after a half time interval Tfix of the positive half-wave. The correct instant of time is determined from the condition of the digital phase synchronization in the finite state machine. Setting and clearing are made possible by the comparator output signal 13 (overcurrent in the series resonant circuit). If a value greater than 20 A is detected, both switches of the MOSFET semi-bridge are turned off. At that instant the current in the series resonant circuit flows through the parasitic reverse diode in the MOSFET back into the d.c. voltage generator power supply. In this, the voltage at the output of the switching amplifier is shifted by 180° with respect to the voltage in the parallel resonant circuit. This causes strong damping of the oscillation. The excess energy is thus not dissipated, but transferred into the output capacitor of the d.c. voltage generator power supply.

In this example of embodiment the current limitation bit remains occupied for at least one period. Simultaneously with the setting of the current limitation bit, a retriggerable monoflop is activated, for example, which sets the current limitation of the d.c. voltage generator power supply to zero. This reduces the output voltage of the d.c. voltage generator power supply until the correct onset of the d.c. voltage-current limitation. As from this moment, the peak current of 20 A is no longer attained in the series resonant circuit. The current in the series resonant circuit is then determined by the output current limitation of the d.c. voltage generator power supply, and the current limitation bit is no longer set.

The selection of the feedback is made as follows. The feedback signal 12 is newly determined for each half-wave. After a certain time has elapsed within the time interval Tfix of the positive half-wave, the comparator output signal 11 (sign ($U_{cf}$—$RL_k$*$L_0$)) is taken into consideration, and the voltage feedback in the parallel resonant circuit or the current feedback in the series resonant circuit is established for the synchronization of the negative half-wave. A corresponding action takes place in the time interval Tfix of the negative half-wave for the synchronization of the positive half-wave. The scanning at a particular point results in a dependence of the feedback change-over on the phase of the load impedance. The states of the finite state machine represent discrete scanning points for the phase synchronization, so that a scanning point can be decoded from the state. The scanning angle than has a small dependence upon the operating frequency of the synchronized generator.

The mathematical expression of the change-over from voltage feedback to current feedback, in which voltage feedback is used when the expression=+1 and current feedback is used when the expression=−1, is for example:

$$\text{sign}(\cos(\omega^*T) - RL_k/|Z|^* \cos(\omega^*T) - \text{angle}(Z))$$

wherein
$\omega$ is the operating frequency of the generator
Z is the load impedance
$RL_k$ is the load impedance at which the change-over is to occur
T is the time of scanning of the comparator output from the beginning of the sinusoidal output voltage sin(w*t).

Figure 4:
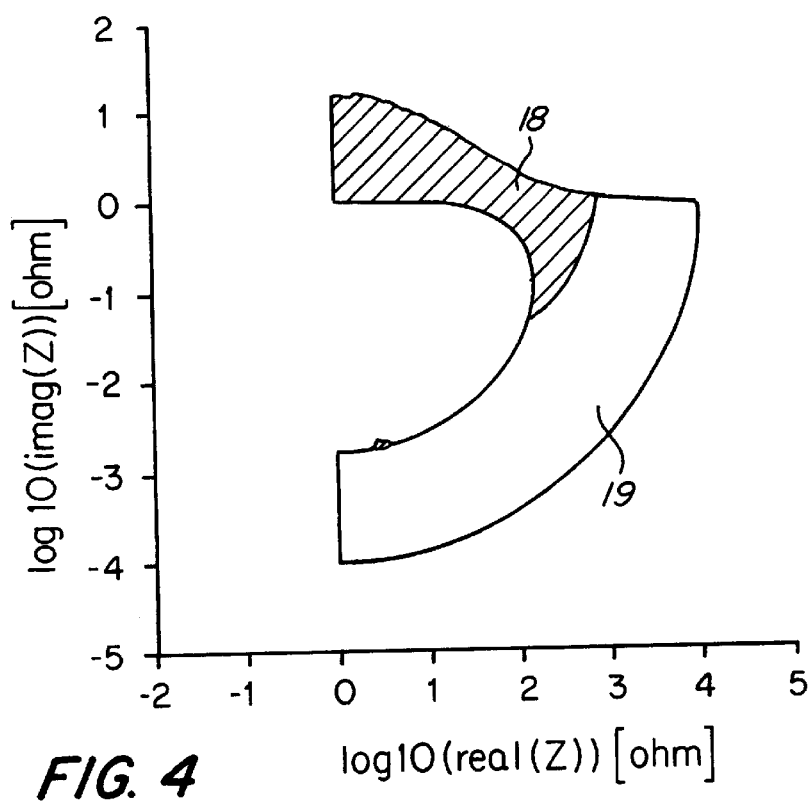
FIG. 4 is a plot corresponding to FIG. 3 for a high frequency power generator according to the present invention.

FIG. 4 shows the dependence of the selection of the feedback at a scanning angle of $\omega^*T/pi^*180=135°$ with $RL_k$=800 ohms.

With a capacitive load of small magnitude the generator tends to perform voltage feedback. This phenomenon occurs at all scanning angles between 90° and 180°. At scanning angles below 90° various undesired phenomena occur. In the diagram the magnitude of the load impedance is limited to10 kiloohms.

If in isolated cases the rapid change-over during the performance of current or voltage feedback close to the critical load resistance $RL_k$ has a detrimental effect on the output current shape, a hysteresis may be provided:

This can be achieved, for example, by changing the sensitivity of the transformer or converter to the voltage $U_{cf}$ or current $I_0$ in dependence upon the kind of feedback. The output or feedback signal 12 of the digital controller 4, which determines the kind of feedback, then simultaneously switches in an attenuator for the voltage $U_{cf}$ or current $I_0$.

Figure 3:
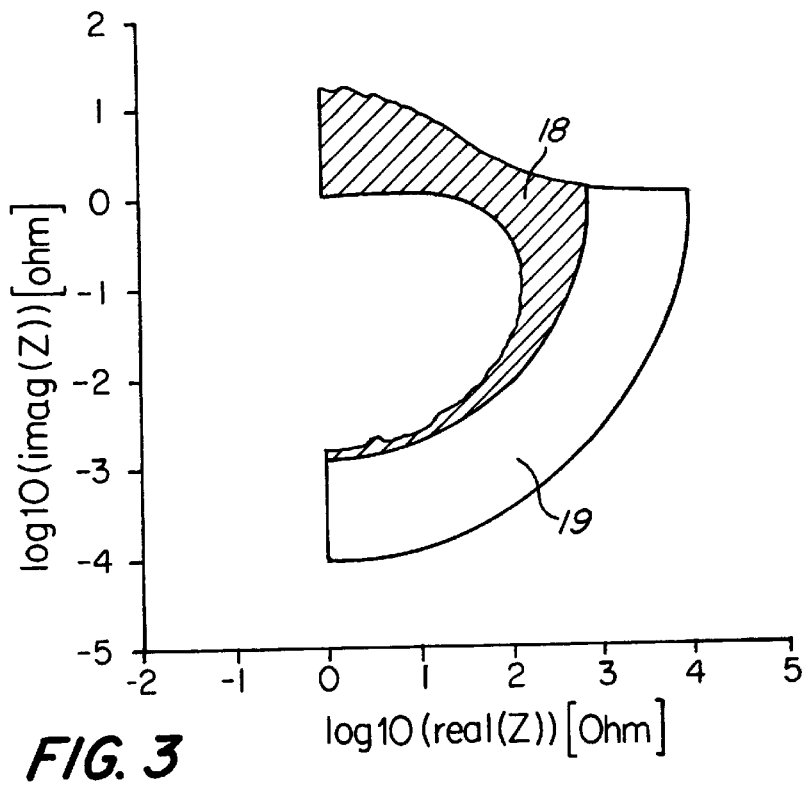
FIG. 3 is a plot of the logarithm of the imaginary part of the load impedance against the logarithm of the real part of the load impedance for a prior art high frequency power generator, to illustrate the ranges in which voltage or current feedback is selected.

FIG. 3 shows the change-over which results with a high frequency high power generator, as disclosed in the document DE-A-38 05 921. Shown are the frequencies of interest at which a synchronization of the phase may occur at 0°. These are frequencies which, with feedback, may be present as generator operating frequencies.

The numeral 18 designates the current feedback and 19 the voltage feedback. In this change-over, only the magnitude of the load impedance is taken into account for the selection of the feedback, so that with capacitive loads of small magnitude the current feedback is likewise selected. In comparison with the taking into account of the phase of the load impedance, this has considerable disadvantages, as is shown by FIG. 5.

Figure 5:
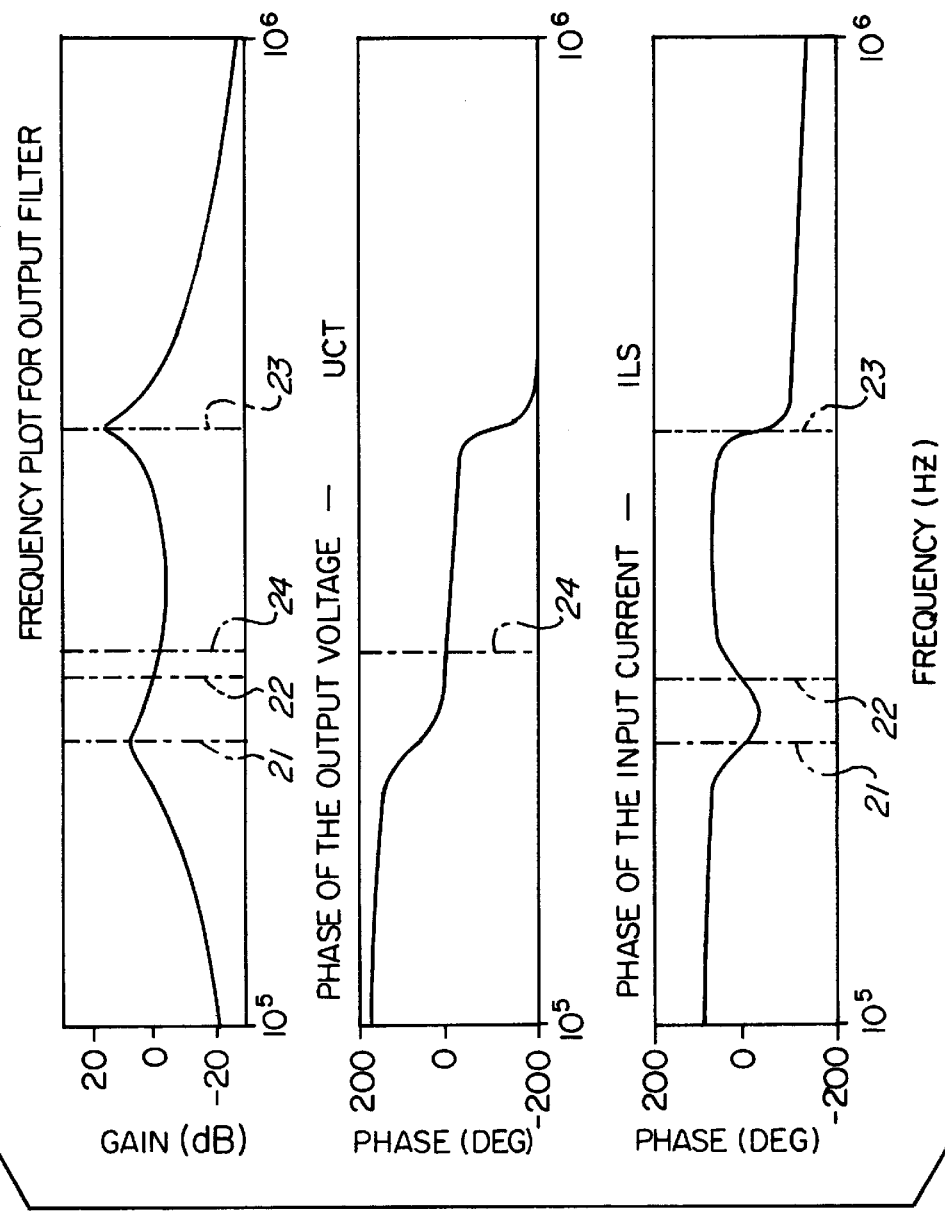
FIG. 5 is a Bode diagram or a Bode plot showing the transmission functions of a typical output filter consisting of a series and a parallel resonant circuit and subjected to a capacitive load.

FIG. 5 shows the characteristics of a typical output filter when subjected to a capacitive load. In the middle illustration of FIG. 5 the generator operates with current feedback and in the lower illustration of FIG. 5 with voltage feedback.

When current feedback is used, two stable operating points result, as represented by the lines 21 and 23. The phase zero passage at line 22 is not stable (limit of oscillatory stability). Both of these operating points cause a strong voltage increase, as is evident from the amplitude response. On the other hand, if a voltage feedback is selected despite the small magnitude of the load impedance, then only one stable operating point is obtained at the line 24. At this operating point there is no voltage exaltation, but an intensification close to 0 dB. Thus, there is only one frequency at which the generator will oscillate stably, this being the very one at which the transformation ratio is not changed. The taking into account of the phase of the load impedance in the selection of the feedback leads to a substantially improved performance of the generator with capacitive loads.

Referring briefly to FIG. 1c, the voltage feedback signal is preferably taken from the parallel resonant circuit by way of a transformer 21 or converter and at least one pulse shaper stage 22. The current feedback signal is preferably taken from the series resonant circuit by way of a transformer 20 or converter and at least one pulse shaper stage 24. By means of these measures the stability of the operating performance of the high frequency power generator is further increased.

The pulse shaper stages 22, 24 are not strictly necessary, but serve to protect the zero passage detector from too large an input signal. To achieve this, the pulse shapers can use diodes to create amplitude limiting or clipping.

FIG. 4 shows the load ranges in which the new high frequency generator uses current feedback or voltage feedback. As compared with the change-over used in the prior art and shown in FIG. 3, the generator of the present invention operates, when under capacitive load, within a greater range using voltage feedback than conventional generators do. This stabilizes the transformation ratio of high frequency output voltage 6 to D.C. supply voltage 5 for capacitive loads, as shown in FIG. 5.

List of Reference Numerals

1. MOSFET semi-bridge
2. L.C. network and sensors
3. Switching block
4. Digital controller
5. Direct current or voltage
6. High frequency output terminal
7. Voltage on the parallel resonant circuit
8. Current in the series resonant circuit
9. Generator output current
10. Limit value setting
11. Comparator signal sign($U_{ot} - R_k * I_{1e}$)
12. Feedback signal
13. Overcurrent signal
14. Phase synchronization signal
15. Start/stop modulation
16. Signal line for limiting the direct current
17. Line for drive signal of the high-side switch and the low-side switch
18. Current feedback
19. Voltage feedback
20. Line of equal frequency
21. Line of equal frequency
22. Line of equal frequency
23. Line of equal frequency
24. Line of equal frequency
25. Flip-flop of the digital phase synchronization circuit
26. Flip-flop to hold the current limiting bit for at least 1 period of the current in the series resonant circuit
27. Signal from the finite state machine to indicate that the state of 13 needs to be saved now
28. Signal to the finite state machine to indicate whether the current limiting bit is set or not. If the bit is set, both high side switch signal and low side switch signal are turned off by the finite state machine by setting both signals FORCE POS. SYNC AND FORCE NEG. SYNC at the same time.
29. Switch

What is claimed is:

1. High frequency power generator, comprising:
   a power amplifier working in switching operation,
   an output filter having at least one series resonant circuit and at least one parallel resonant circuit, and
   a digital controller including a phase-synchronizable oscillator,
   wherein the frequency of the drive voltage of the power amplifier is produced upon stimulation of oscillation by the digital controller with the timing pulse of the oscillator, and the digital controller filters off feedback from the high frequency power generator in such a manner that the frequency of the drive voltage of the power amplifier lies in a defined frequency range.

2. High frequency power generator according to claim 1, wherein the drive voltage of the power amplifier is also generated by the digital controller after the stimulation of oscillation.

3. High frequency power generator according to claim 2, wherein no change-over occurs between external excitation and self-excitation of the high-frequency power generator.

4. High frequency power generator according to claim 1, wherein a voltage derived from a feedback signal from the output current circuit or output voltage circuit of the high frequency power generator is used to synchronize the drive voltage of the power amplifier.

5. High frequency power generator according to claim 1, wherein the series resonant circuit is the first filter component connected to the power amplifier.

6. High frequency power generator according to claim 1, wherein the oscillator is a quartz oscillator.

7. High frequency power generator according to claim 1, wherein the resonant circuits are tuned approximately to the mean operating frequency.

8. High frequency power generator according to claim 1, wherein a current feedback occurs when the magnitude of the load impedance of the output circuit is less than a preset value dependent upon the phase of the load impedance.

9. High frequency power generator according to claim 8, wherein the feedback signal is formed from the output circuit via a transformer and at least one pulse shaper stage from the current flowing through the series resonant circuit.

10. High frequency power generator according to claim 1, wherein a voltage feedback occurs when the magnitude of the load impedance of the output circuit exceeds a preset value dependent upon the phase of the load impedance.

11. High frequency power generator according to claim 10, wherein the feedback signal is formed via a transformer and at least one pulse shaper stage from the output circuit voltage which is present on the parallel resonant circuit.

12. High frequency power generator according to claim 8, wherein a switch is provided which performs the change-over between current and voltage feedback also during operation.

13. High frequency power generator according to claim 1, wherein a current limitation is provided in the form of a flip-flop.

14. High frequency power generator according to any one of claims 8 to 13, wherein the kind of feedback is newly set at each half-wave.

15. High frequency power generator according to claim 1, wherein the oscillator is a component of the digital controller.

16. High frequency power amplifier according to claim 1, wherein the change-over between the kinds of feedback takes place with hysteresis.

17. High frequency power amplifier according to claim 1, wherein the switching amplifier is operated at frequencies of about 300kHz.

18. High frequency power amplifier according to claim 17, wherein the switching amplifier uses MOSFET transistors.

* * * * *

UNITED STATES PATENT AND TRADEMARK OFFICE
CERTIFICATE OF CORRECTION

PATENT NO. : 6,229,393 B1　　　　　　　　　　　　　　　　　　　　Page 1 of 1
DATED : May 8, 2001
INVENTOR(S) : Felix Daners It is certified that error appears in the above-identified patent and that said Letters Patent is hereby corrected as shown below:

<u>Title page,</u>
Item [73] Assignee should read as follows:
-- [73] Assignee: Storz Endoskop GmbH (CH) --

Signed and Sealed this

Fourteenth Day of May, 2002

Attest:

JAMES E. ROGAN
*Attesting Officer*　　*Director of the United States Patent and Trademark Office*